(12) United States Patent
Foo

(10) Patent No.: US 7,323,871 B2
(45) Date of Patent: Jan. 29, 2008

(54) METHOD AND SYSTEM OF MR IMAGING WITH SIMULTANEOUS FAT SUPPRESSION AND $T_1$ INVERSION RECOVERY CONTRAST

(75) Inventor: Thomas K. F. Foo, Potomac, MD (US)

(73) Assignee: General Electric Company, Schenectady, NY (US)

( * ) Notice: Subject to any disclaimer, the term of this patent is extended or adjusted under 35 U.S.C. 154(b) by 41 days.

(21) Appl. No.: 11/176,718

(22) Filed: Jul. 7, 2005

(65) Prior Publication Data

US 2007/0007958 A1    Jan. 11, 2007

(51) Int. Cl.
*G01V 3/00* (2006.01)

(52) U.S. Cl. .......................................... 324/307

(58) Field of Classification Search ......... 324/300–322
See application file for complete search history.

(56) References Cited

U.S. PATENT DOCUMENTS

| | | | | |
|---|---|---|---|---|
| 5,256,967 A * | 10/1993 | Foo et al. | ..................... | 324/311 |
| 5,347,216 A * | 9/1994 | Foo | ............................. | 324/309 |
| 5,429,134 A * | 7/1995 | Foo | ............................. | 600/413 |
| 5,652,516 A * | 7/1997 | Adalsteinsson et al. | ..... | 324/309 |
| 6,167,293 A * | 12/2000 | Chenevert et al. | .......... | 600/420 |
| 6,304,084 B1 * | 10/2001 | Star-Lack et al. | ............ | 324/307 |
| 6,441,613 B1 * | 8/2002 | Rosenfeld et al. | ........... | 324/314 |
| 6,483,307 B2 * | 11/2002 | Ookawa | ...................... | 324/309 |
| 6,583,623 B1 * | 6/2003 | Kwok et al. | ................. | 324/307 |
| 6,963,768 B2 * | 11/2005 | Ho et al. | ..................... | 600/415 |
| 7,034,530 B2 * | 4/2006 | Ahluwalia et al. | .......... | 324/309 |
| 7,071,689 B2 * | 7/2006 | Golay et al. | ................. | 324/309 |

OTHER PUBLICATIONS

O. P. Simonetti et al., An Improved MR Imaging Technique for the Visualization of Myocradial Infarction, *Radiology* 2001; 218:215-223.

* cited by examiner

*Primary Examiner*—Brij Shrivastav
*Assistant Examiner*—Dixomara Vargas
(74) *Attorney, Agent, or Firm*—Ziolkowski Patent Solutions Group, SC

(57) ABSTRACT

A method and system for fat suppression with $T_1$-weighted imaging includes a pulse sequence generally constructed to have a non-spectrally selective IR pulse that is played out immediately before a spectrally selective IR tip-up pulse. Thereafter, a fat suppression RF pulse is played out followed by the acquisition of fat-suppressed MR data. The pulse sequence maintains $T_1$ contrast by not perturbing the non-fat signals from the IR preparation. The pulse sequence also ensures that the blood pool signal is homogeneously suppressed from the non-spectrally selective IR RF pulse. The pulse sequence also allows for increased fat suppression and provides flexibility for adjustment of the degree of fat suppression without affecting the view acquisition order for an image acquisition segment.

27 Claims, 5 Drawing Sheets

METHOD AND SYSTEM OF MR IMAGING WITH SIMULTANEOUS FAT SUPPRESSION AND $T_1$ INVERSION RECOVERY CONTRAST

BACKGROUND OF THE INVENTION

The present invention relates generally to diagnostic imaging and, more particularly, to a method and system of achieving simultaneous fat suppression and $T_1$ inversion recovery contrast in magnetic resonance (MR) imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Inversion recovery (IR) magnetization preparation is an imaging technique that is often used to capture $T_1$ contrast in MR images. Inversion recovery magnetization preparation typically includes the application of an initial 180 degree RF pulse to invert the longitudinal magnetization of tissue. Thus, the $T_1$ relaxation times of the tissue are emphasized by having the longitudinal magnetization recover from a maximal $-M_o$ to $+M_o$ (where $M_o$ is the equilibrium magnetization). A potential drawback of IR magnetization preparation is that data acquired from fat can cause a relatively bright signal to appear in the image due to the shorter $T_1$ time of fat relative to other tissues. This can complicate identification of lesions and other pathologies. This can be particularly problematic for myocardial delayed enhancement (MDE) imaging as well as abdominal imaging where contrast-enhanced lesions are iso-intense with fat.

Myocardial delayed enhancement imaging is a technique that is used to assess the viability of myocardium. The presence of hyper-enhancement following a bolus of gadolinium contrast media indicates the presence of myocardial infarction. One method for MDE utilizes a non-selective (NS) IR preparation segment with a segmented ECG-gated gradient echo (GRE) readout. In these images, fat is usually of high signal intensity. This leads to increased motion-related artifacts from ghosting of fat from the chest wall if the patient is unable to maintain a breath-hold or possibly more significant aliasing artifacts from fat within the shoulder when fields-of-view (FOVs) are small. Furthermore, bright signal from pericardial fat may obscure proper identification of enhancing infarcted tissue over suppressed myocardium, which may be particularly problematic in regions of thinned myocardium such as in areas of chronic infarction or the right ventricle.

As such, for MDE and other scans that include IR magnetization preparations, a fat suppression pulse is used to improve lesion conspicuity by reducing or suppressing the bright fat signal. Typically, the spectrally selective, fat suppression pulse is played out immediately prior to data acquisition. As such, the desired $T_1$ contrast is obtained by a choice of the effective IR interval time, $TI_{\mathit{eff}}$. The effective IR interval time is generally determined from both the physical delay of the start of the image acquisition segment from the IR pulse and the time from the start of the imaging segment to the acquisition of the central k-space view. It is well-known that the flip angle of the fat suppression RF pulse and the time from that pulse to the acquisition of the central k-space view can be adjusted for optimal fat suppression. It is preferred that the longitudinal magnetization of fat be at or near zero during the acquisition of the central k-space views for optimal fat suppression.

A conventional SPEC-IR (spectrally selective IR) pulse sequence often used in MDE studies is illustrated in FIG. 1. As shown, the pulse sequence 2 is segmented into an IR magnetization preparation segment 3 and an acquisition segment 4. The preparation segment 3 is defined by an IR preparation RF pulse 5 and a spectrally selective (fat) suppression RF pulse 6. Ideally, the fat longitudinal magnetization is nulled at the acquisition of the central k-space views 7 which is coincident with the effective TI time for optimal fat suppression. The time period observed between application of the fat suppression RF pulse and the acquisition of the central k-space views is referred to as $TI_{fat}$.

A disadvantage of this imaging technique for fat suppression is that it is dependent upon the longitudinal magnetization of fat being nulled at $TI_{fat}$ from the fat suppression RF pulse. Moreover, this nulling is dependent on the longitudinal fat magnetization at the time the fat suppression RF pulse 6 is applied as the IR pulse 5 is non-selective. This is mathematically illustrated in Eqns. 1-4 below. Given t=0 is the time the IR pulse 5 is applied and at t=$TI_{\mathit{eff}}$ is the time that central k-space views are acquired, then the fat signal that is obtained is a function of the longitudinal magnetization of fat at t=$TI_{\mathit{eff}}$. The effective inversion time is defined as the time from the peak of the IR pulse to the acquisition of the central k-space views in the image acquisition segment.

The fat signal intensity can be thus written as:

$$SI_{fat} \propto -M_{z,fat} \exp(-TI_{fat}/T_{1fat}) + M_o(1-\exp(-TI_{fat}/T_{1fat})) \quad \text{Eqn. 1,}$$

where $T1_{fat}$ is the T1 value for fat and $M_{z,fat}$ is the longitudinal magnetization of fat at t=($TI_{\mathit{eff}}$−$TI_{fat}$), and is given by:

$$M_{z,fat} = M_{zeq,fat} \exp(-t_{fatsat}/T_{1fat}) + M_o(1-\exp(-t_{fatsat}/T_{1fat})) \quad \text{Eqn. 2.}$$

$M_{zeq,fat}$ denotes the equilibrium longitudinal magnetization of fat at the time the IR pulse is applied and accounts for the recovery of magnetization after the end of the image acquisition segment, and $t_{fatsat}$ denotes the time when the fat suppression pulse is played out. For optimum nulling of fat signal, $$M_{z,fat} \exp(-TI_{fat}/T_{1fat}) = M_o(1-\exp(-TI_{fat}/T_{1fat})) \quad \text{Eqn. 3, and}$$

$$TI_{fat} = T_{1fat} \ln((M_{z,fat}+M_o)/M_o) \quad \text{Eqn. 4.}$$

For fat to be effectively suppressed, $TI_{fat} = TI_{\mathit{eff}} - t_{fatsat}$. As the time is dependent on $M_{z,fat}$, it can be difficult to determine a solution for $TI_{fat}$ or that the solution changes from patient to patient, depending on the variation in $M_{z,fat}$ according to Eqn. 2. As such, this conventional approach is not reliable for fat suppression in an IR T1-weighted acquisition.

However, as $T_1$ contrast imaging is a preferred technique to identify lesions in abdominal and myocardium imaging, it is desirable to not perturb the true inversion time, TI, and the effective inversion time, $TI_{eff}$. This is because, depending on the TI used and other sequence parameters, there may not be an optimal $TI_{fatsat}$ to null fat without having to change the primary TI time.

One proposed technique for providing fat suppression while maintaining $T_1$ contrast is to use a spectrally selective inversion pulse set to the water peak and a spectrally selective inversion pulse set to fat. A drawback of this double spectrally selective IR scheme is that if there is substantial magnetic field inhomogeneity, blood outside the imaged slice may be not sufficiently inverted. This can contribute to image artifacts and, in particular, for a myocardial viability study, bright signal in the ventricle.

It would therefore be desirable to have a system and method capable of IR imaging with fat suppression that maintains the benefits of IR magnetization preparation. It would also be desirable to have an imaging technique that globally or uniformly inverts blood magnetization.

BRIEF DESCRIPTION OF THE INVENTION

The present invention provides a system and method for achieving simultaneous fat suppression and $T_1$ IR contrast in MR imaging.

The present invention is directed to a pulse sequence for fat suppression with $T_1$-weighted imaging. The pulse sequence is particularly beneficial in abdominal imaging where the time-course enhancement of lesions can be more remarkable without the high signal from abdominal fat masking small lesions. The invention is also particularly applicable to cardiac imaging and the suppression of pericardial fat that can otherwise affect the identification of epicardial margins of an infarcted zone or obscure the true extent of myocardial enhancement in patients with myocarditis. Moreover, the present invention is beneficial in suppressing signal from the pericardial fat that may obscure enhancement of the thin right ventricular myocardial wall in cases where the primary left ventricular myocardial infarction involves the right ventricular myocardium.

The pulse sequence is generally constructed to have a non-spectrally selective IR pulse that is played out immediately before a spectrally selective IR tip-up pulse. Thereafter, a fat suppression RF pulse is played out followed by the acquisition of fat-suppressed MR data. The pulse sequence maintains $T_1$ contrast by not perturbing the non-fat signals from the IR preparation. The pulse sequence also ensures that the blood pool signal is homogeneously suppressed from the non-spectrally selective IR RF pulse. The pulse sequence also allows for increased fat suppression and provides flexibility for adjustment of the degree of fat suppression without affecting the view acquisition order for the image acquisition segment.

Therefore, in accordance with one aspect of the invention, an MR apparatus includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer programmed to apply a pulse sequence designed to achieve simultaneous fat suppression and $T_1$ inversion recovery contrast in an MR image with uniform blood magnetization during MR data acquisition in an inhomogeneous $B_o$ field.

According to another aspect, the present invention includes a method of MR imaging with fat suppression that includes non-selectively inverting spins in a region-of-interest (ROI) and restoring longitudinal magnetization of fat spins in the ROI. The method further includes suppressing longitudinal magnetization of the fat spins after the longitudinal magnetization is restored to its equilibrium and acquiring MR signals from the ROI.

In accordance with yet a further aspect, the invention includes a pulse sequence to be carried out by an MR scanner. The pulse sequence includes a preparatory segment defined by a primary IR prep RF pulse that is non-spectrally selective, a secondary IR prep RF pulse that is spectrally selective, and a spectrum-targeted suppression RF pulse. The pulse sequence further has an acquisition segment defined by a readout sequence.

In accordance with another aspect, the invention is embodied in a computer program stored on a computer readable storage medium and having instructions which, when executed by a computer, cause the computer to apply a non-spectrally selective IR pulse and apply a spectrally selective IR pulse immediately after the non-spectrally selective IR pulse. The computer is further caused to apply a fat suppression RF pulse and acquire fat suppressed MR data.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 4 is a plot of percentage of fat suppression using the pulse sequence illustrated in FIG. 1 and fat suppression using the pulse sequence illustrated in FIG. 3.

DETAILED DESCRIPTION OF THE PREFERRED EMBODIMENT

Figure 2:
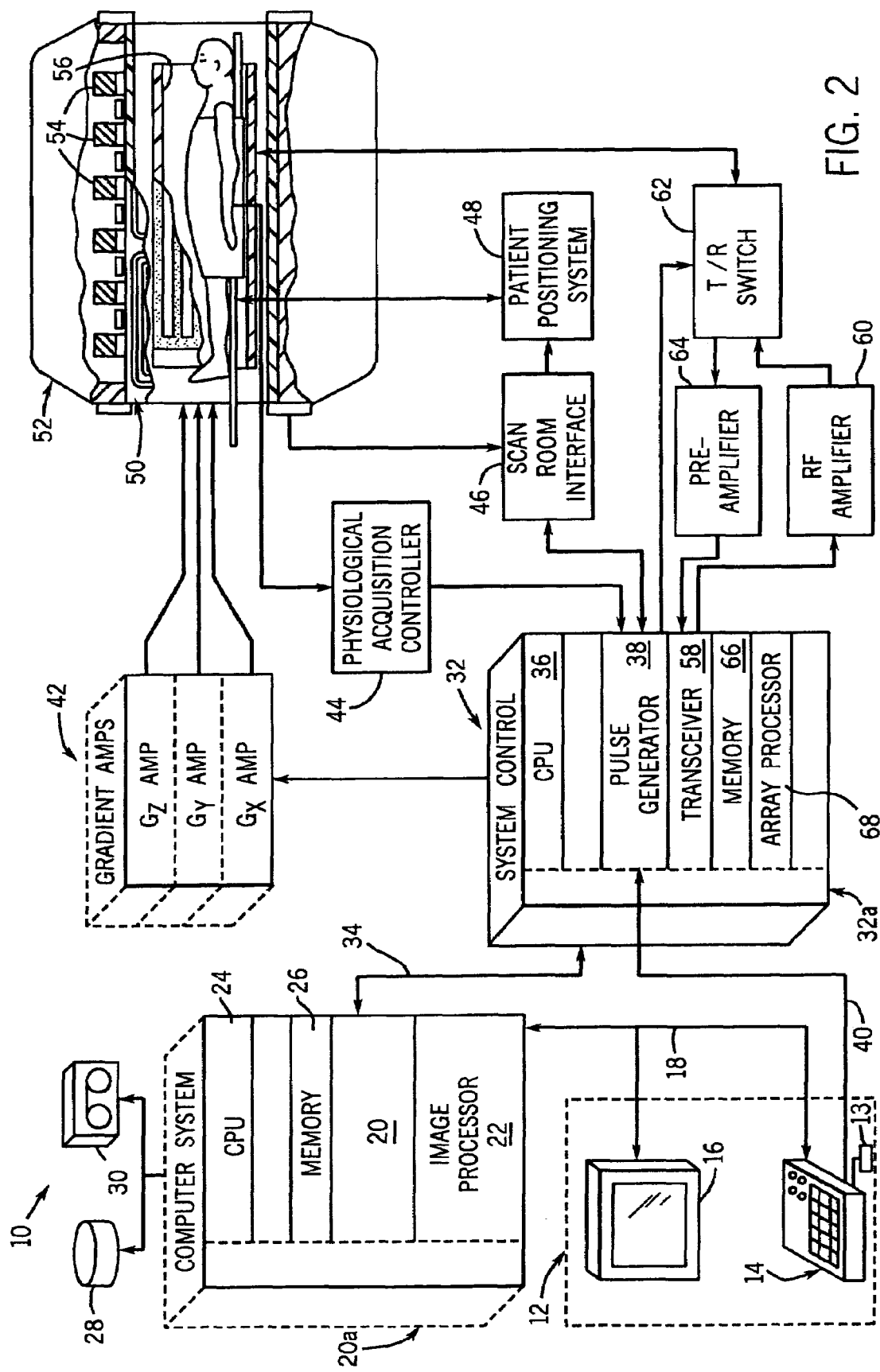
FIG. 2 is a schematic block diagram of an MR imaging system for use with the present invention.

Referring to FIG. 2, the major components of an MR imaging system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to an IR pulse sequence with fat suppression that may be carried out using the MR system illustrated in FIG. 2, or equivalents thereof. While the pulse sequence is particularly beneficial to abdominal and cardiac studies, it is contemplated that the sequence may be used for other anatomical studies.

Figure 3:
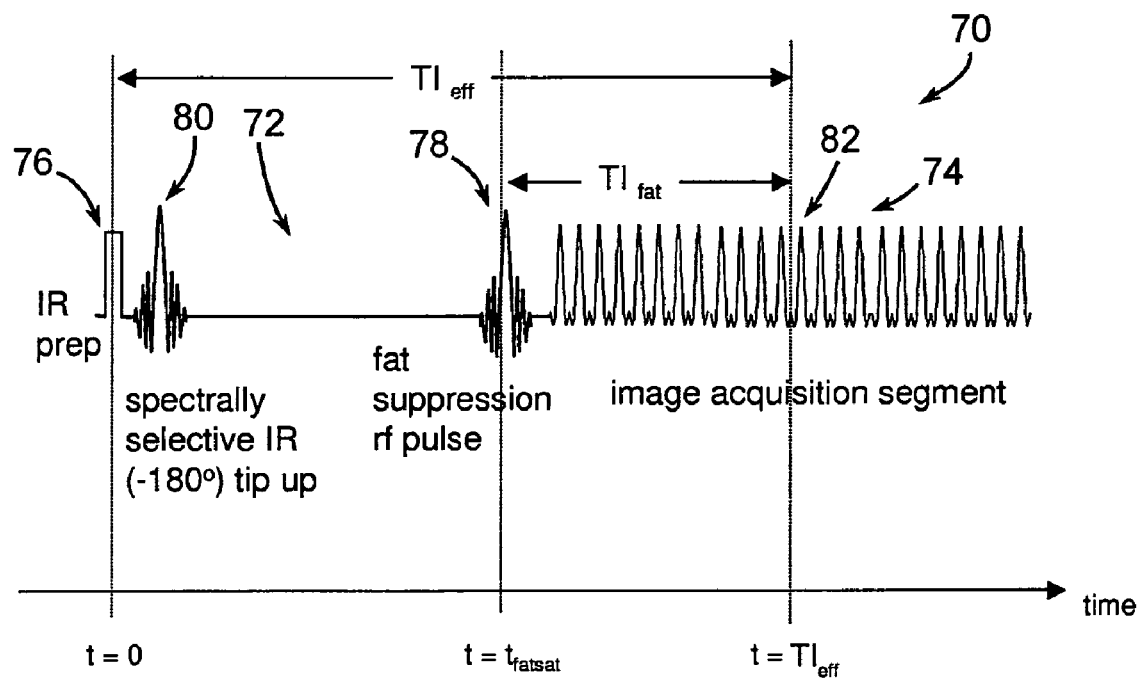
FIG. 3 is a schematic representation of a pulse sequence for simultaneous fat suppression and IR contrast in accordance with the present invention.

Referring now to FIG. 3, a pulse sequence for simultaneously achieving fat suppression and $T_1$ IR contrast is illustrated. The pulse sequence 70 is defined to have an IR magnetization preparation segment 72 and an image acquisition segment 74 that follows the preparation segment. The bounds of the preparation segment 72 are defined by a non-spectrally selective IR pulse 76 and a fat suppression RF pulse 78. Played out immediately after the non-selective IR pulse 76 is a spectrally selective IR tip-up pulse 80. The fat suppression RF pulse 78 is preferably played out when the magnetization of fat has recovered to its equilibrium value. Further, the flip angle of the fat suppression RF pulse 78 and the timing of data acquisition during the image acquisition segment 74 are controlled such that the central k-space views 82 are acquired when the signal from fat is nulled. The time between the application of the fat suppression RF pulse 78 and the acquisition of the central k-space views 82 is identified as $TI_{fat}$. The time period between application of the spectrally non-selective IR pulse 76 and the acquisition of the central k-space views 82 is identified as $TI_{eff}$.

As described above, pulse sequence 70 includes a tip-up pulse 80. As the non-selective RF pulse 76 inverts all spins, a fat selective tip-up pulse 80 at a flip angle of −180 degrees is played out immediately following the IR pulse 76. This restores the fat longitudinal magnetization, $M_{z,fat}$. As such, $M_{z,fat}$ can continue to recover to its equilibrium value of $M_0$, which is a constant value. Hence, the present invention allows fat suppression to be controlled through the $TI_{fat}$ time and the flip angle, $\Theta$, of the fat suppression RF pulse 78.

That is, given $M_{z,fat} \to M_0$, then the fat signal is defined by:

$$SI_{fat} \propto M_0 \cos(\Theta)\exp(-TI_{fat}/T_{1fat}) + M_0(1-\exp(-TI_{fat}/T_{1fat})) \quad \text{(Eqn. 5), and}$$

$$\Theta = \cos^{-1}[(1-\exp(-TI_{fat}/T_{1fat}))/\exp(-TI_{fat}/T_{1fat})] \quad \text{(Eqn. 6).}$$

Thus, there are two independent controls to null the fat signal: the fat suppression RF pulse flip angle and the delay after application of the fat suppression RF pulse to the central k-space views, i.e., $TI_{fat}$.

Figure 4:
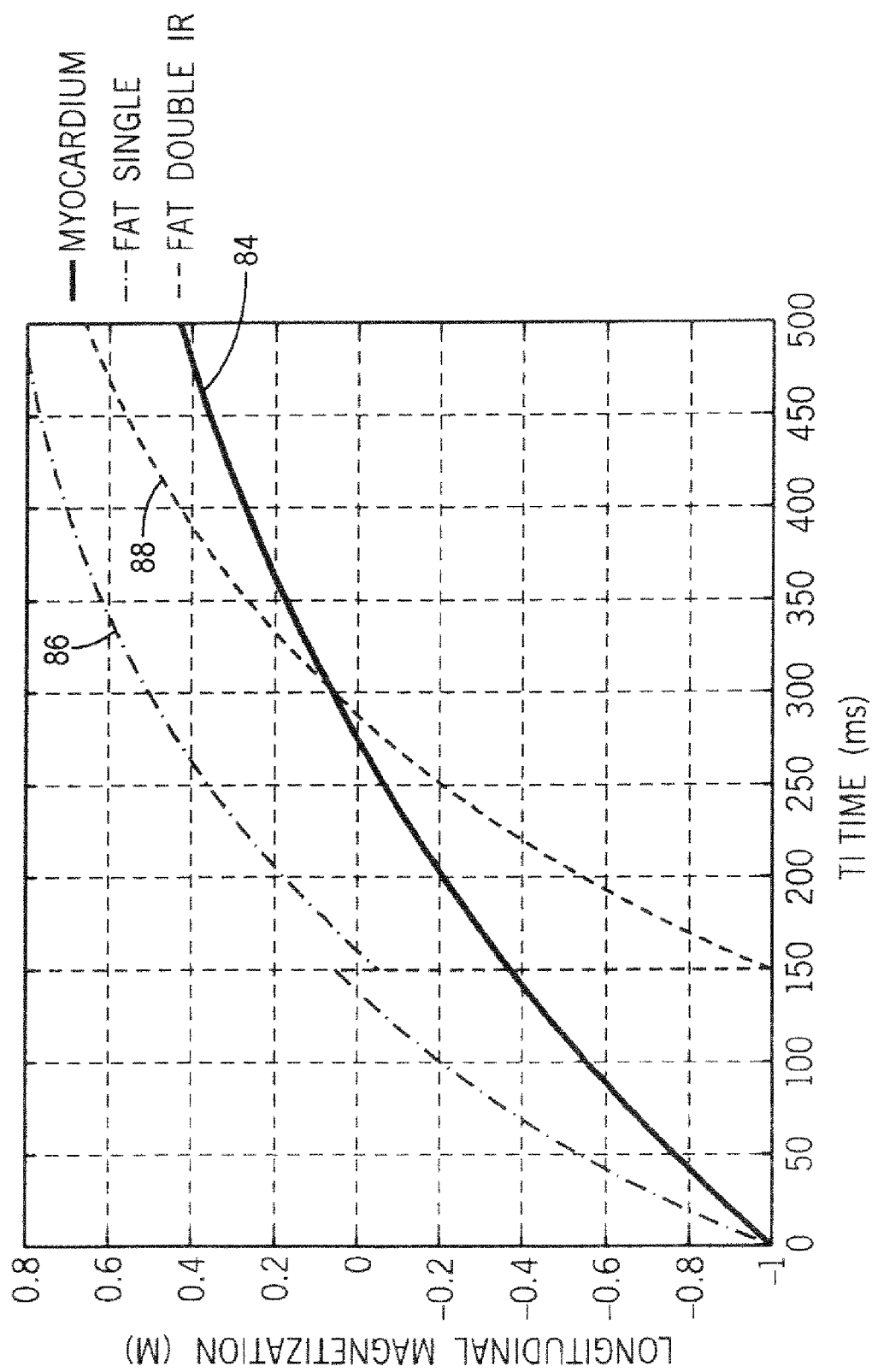
FIG. 4 is a plot of longitudinal magnetization as a function of time for a known fat suppression pulse sequence and for the pulse sequence illustrated in FIG. 3.

Referring now to FIG. 4, plots of longitudinal magnetization as a function of time for a conventional IR pulse sequence with fat suppression and the pulse sequence of FIG. 3 are shown. For purposes of illustration, a non-selective IR pulse is applied at t=0. A fat suppression RF pulse with a 180 degree flip angle is applied at t=150 ms. Longitudinal magnetization of myocardial tissue 84 is nulled at a TI of approximately 300 ms. If a single fat suppression pulse is used, as in conventional approaches, the trajectory of the fat longitudinal magnetization 86 indicates less than optimal fat suppression at t=300 ms, the null point of myocardial tissue. On the other hand, with the pulse sequence illustrated in FIG. 3 and corresponding to line 88, effective fat suppression is achieved at t=300 ms and is coincident with the nulling of the myocardial tissue.

As also shown in FIG. 4, the effect of the single non-selective IR pulse of the conventional pulse sequence results in inversion of the fat magnetization followed by its recovery. At the moment when the fat suppression RF pulse is applied, the fat longitudinal magnetization has not completely recovered to its equilibrium value. Hence, the fat signal is not nulled when the central k-space views are acquired at t=300 ms. In contrast, using a spectrally selective tip-up pulse immediately after the non-selective IR pulse restores the fat longitudinal magnetization. As such, when the fat suppression RF pulse is applied at t=150 ms, the fat longitudinal magnetization is at its constant equilibrium value. As a result, fat suppression is improved during acquisition of the central k-space views at t=300 ms.

Figure 1:
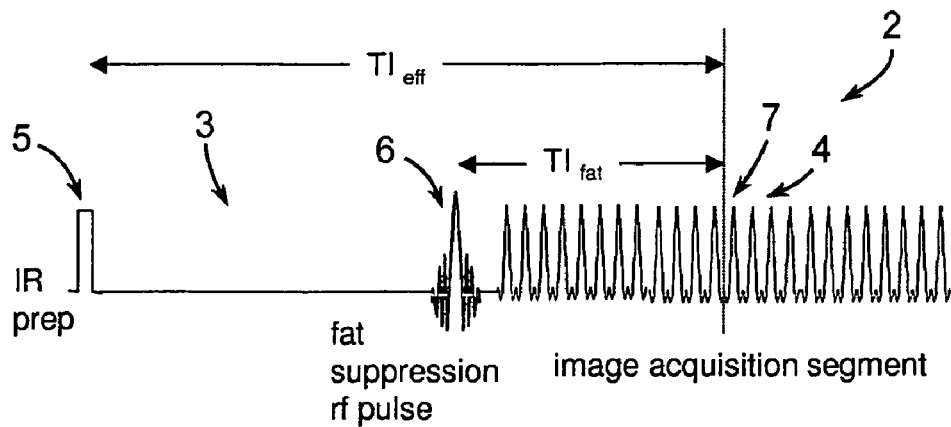
FIG. 1 is a schematic representation of a known T1 IR pulse sequence with spectrally selective fat suppression.

Testing of the pulse sequence illustrated in FIG. 3 was carried out with an ECG-gated IR fast gradient recalled echo (FGRE) acquisition used for imaging delayed hyper-enhancement for myocardial viability assessment on a 1.5 Signa® CV/I MR imaging system commercial available from GE Healthcare of Waukesha, Wis. Signa® is a registered trademark of General Electric Co. of Schenectady, N.Y. Data was acquired from a fat and water phantom using a 2D segmented k-paced ECG-gated IR-prepared FGRE acquisition. Acquisition parameters were: $TI_{eff}$=250 ms, 256×192 k-space matrix, 36 cm FOV, 24 views per segment, and 2 signal averages. Breath-hold times were between 10-16 seconds depending on heart rate. Imges were acquired at different flip angles for the fat suppression RF pulse. Signal intensities were measured as a function of IR flip angle for both fat and water. The percent suppression of the fat and the water signals for the pulse sequence illustrated in FIG. 1 as well as the pulse sequence illustrated in FIG. 3 were plotted and compared.

Figure 5:
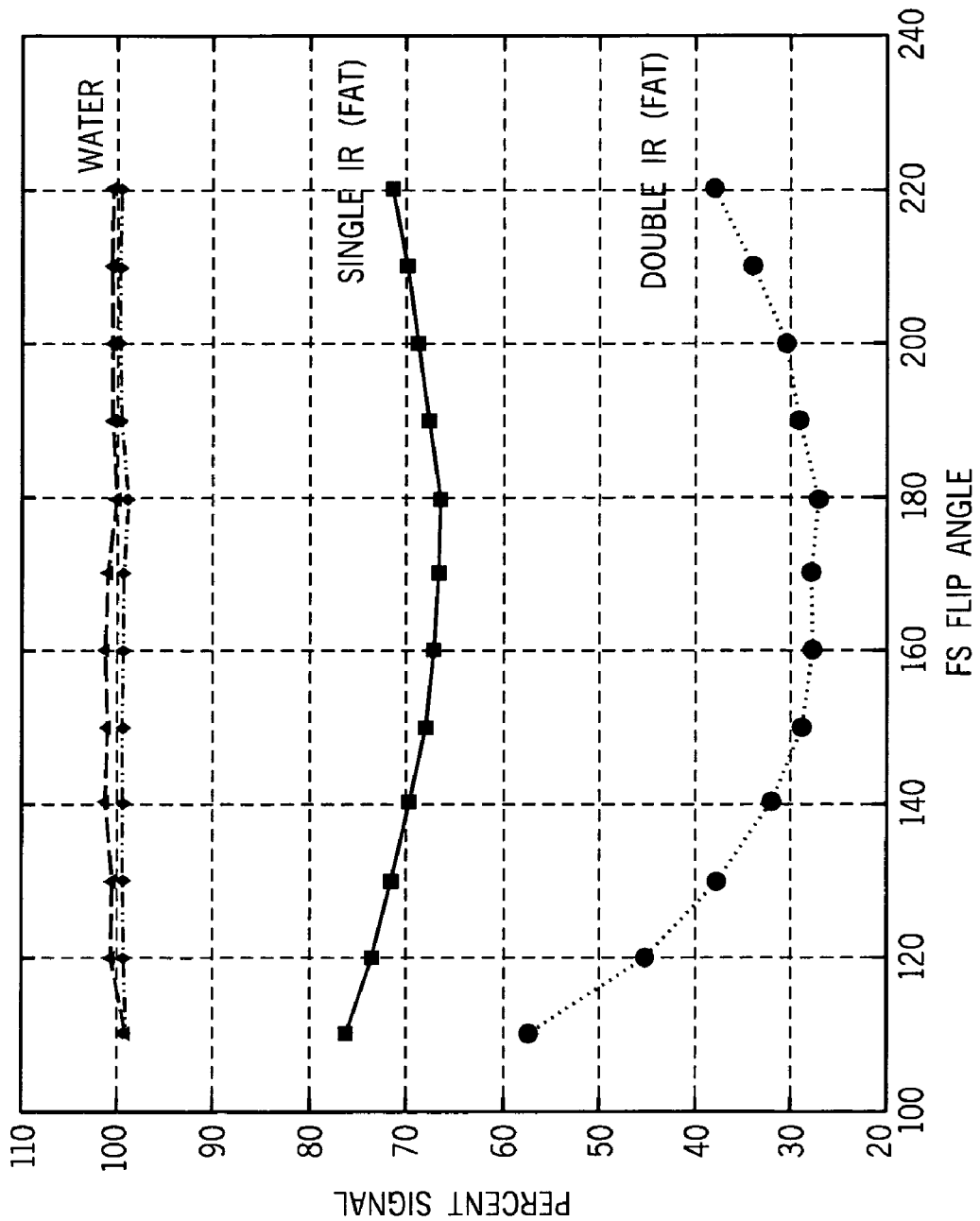

As shown in FIG. 5, fat suppression is more effective using the double IR fat suppression pulse sequence illustrated in FIG. 3. Over the range of the fat suppression RF pulse flip angles, water suppression is relatively unperturbed using both sequences. However, fat suppression is improved with the pulse sequence of FIG. 3 because of improved nulling of the fat signal. This can be attributed to the fact that at the time the central k-space views were acquired, the fat signal using the conventional sequence illustrated in FIG. 1 could not be sufficiently nulled. As the example illustrates, for a fixed $TI_{fat}$, optimal fat suppression can be obtained by a judicious choice of the fat suppression flip angle. In the illustrated example, a flip angle of approximately 170 degrees is preferred. Moreover, improved fat suppression is achieved while being transparent to the $T_1$-weighted IR-prepared acquisition sequence.

Figure 7:
FIG. 7 is an image similar to that of FIG. 6, but acquired using the pulse sequence illustrated in FIG. 3.
Figure 6:
FIG. 6 is an image for a delayed enhancement myocardial study using the pulse sequence illustrated in FIG. 1.

Referring now to FIGS. 6-7, clinical images acquired according to a delayed enhancement myocardial viability study are shown. FIG. 6 is an image acquired using a convention pulse sequence and FIG. 7 is an image acquired using the pulse sequence illustrated in FIG. 3. As shown in FIG. 6, with the conventional single IR pulse prepared GRE sequence, fat in the chest wall and the pericardial fat are less than optimally suppressed. On the other hand, as illustrated in FIG. 7, fat in the chest wall and the pericardial fat are suppressed while not affecting the contrast between the myocardium and the enhancing tissue within the myocardium when data is acquired with the pulse sequence illustrated in FIG. 3.

Therefore, an MR apparatus is disclosed and includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer programmed to apply a pulse sequence designed to achieve simultaneous fat suppression and $T_1$ inversion recovery contrast in an MR image with uniform blood magnetization during MR data acquisition in an inhomogeneous $B_o$ field.

The present invention further includes a method of MR imaging with fat suppression that includes non-selectively inverting spins in a region-of-interest (ROI) and restoring longitudinal magnetization of fat spins in the ROI. The method further includes suppressing longitudinal magnetization of the fat spins after the longitudinal magnetization is restored to its equilibrium and acquiring MR signals from the ROI.

The invention also includes a pulse sequence to be carried out by an MR scanner. The pulse sequence includes a preparatory segment defined by a primary IR prep RF pulse that is non-spectrally selective, a secondary IR prep RF pulse that is spectrally selective, and a spectrum-targeted suppression RF pulse. The pulse sequence further has an acquisition segment defined by a readout sequence.

The invention is also embodied in a computer program stored on a computer readable storage medium and having instructions which, when executed by a computer, cause the computer to apply a non-spectrally selective IR pulse and apply a spectrally selective IR pulse immediately after the non-spectrally selective IR pulse. The computer is further caused to apply a fat suppression RF pulse and acquire fat suppressed MR data.

The present invention has been described in terms of the preferred embodiment, and it is recognized that equivalents, alternatives, and modifications, aside from those expressly stated, are possible and within the scope of the appending claims.

What is claimed is:

1. A magnetic resonance imaging system comprising:
   a plurality of gradient coils positioned about a bore of a magnet to impress a polarizing magnetic field and an RF transceiver system and an RF switch controlled by a pulse module to transmit RF signals to an RE coil assembly to acquire MR images; and
   a computer programmed to apply a pulse sequence designed to achieve simultaneous fat suppression and $T_1$ inversion recovery contrast in an MR image with uniform blood magnetization during MR data acquisition in an inhomogeneous $B_0$ field.

2. The MR imaging system of claim 1 wherein the pulse sequence is defined by a pair of inversion recovery (IR) pulses played out before application of a fat suppression RF pulse.

3. The MR imaging system of claim 2 wherein a first IR pulse of the pair of IR pulses is non-selective and a second IR pulse of the pair of IR pulses is played out immediately following the first IR pulse and is fat selective.

4. The MR imaging system of claim 3 wherein the second IR pulse is designed to restore longitudinal magnetization of fat inverted by the first IR pulse.

5. The MR imaging system of claim 3 wherein the second IR pulse has a tip-up angle of approximately −180 degrees.

6. The MR imaging system of claim 3 wherein the computer is further programmed to acquire central k-space views of k-space when signal from fat is nulled.

7. The MR imaging system of claim 6 wherein the computer is further programmed to apply the fat suppression RF pulse at a flip angle such that signal from fat is nulled during acquisition of the central k-space views of k-space.

8. The MR imaging system of claim 7 wherein the computer is further programmed to determine a delay time after application of the fat suppression RF pulse in which signal from fat will be nulled, and acquire the central k-space views upon expiration of the delay time after application of the fat suppression RF pulse.

9. The MR imaging system of claim 7 wherein the fat suppression RF pulse has a flip angle defined by:

$$\Theta = \cos^{-1}[(1-\exp(-TI_{fat}/T_{1fat}))/\exp(-TI_{fat}/T_{1fat})],$$

where:
$TI_{fat}$=time from application of the fat suppression RF pulse to acquisition of central k-space views; and
$T_{1fat}$=$T_1$ value for fat.

10. The MR imaging system of claim 1 configured for at least one of abdominal MR imaging and cardiac myocardial imaging.

11. A method of MR imaging with fat suppression comprising the steps of:
non-selectively inverting spins in a region-of-interest (ROI);
restoring longitudinal magnetization of fat spins in the ROI;
suppressing longitudinal magnetization of the fat spins after the longitudinal magnetization is restored to an equilibrium; and
acquiring MR signals from the ROI; and
reconstructing an MR image from the acquired MR signals.

12. The method of claim 11 wherein the step of restoring longitudinal magnetization includes applying a fat selective IR pulse.

13. The method of claim 12 wherein the fat selective IR pulse has a tip-up angle of approximately −180 degrees.

14. The method of claim 11 wherein the step of suppressing longitudinal magnetization includes applying a fat suppression RF pulse having a flip angle, $\Theta$, defined by:

$$\Theta = \cos^{-1}[(1-\exp(-TI_{fat}/T_{1fat}))/\exp(-TI_{fat}/T_{1fat})]$$

where:
$TI_{fat}$=time from application of the fat suppression RF pulse to acquisition of central k-space views; and
$T_{1fat}$=$T_1$ value of fat.

15. The method of claim 11 wherein the step of acquiring MR signals includes the step of acquiring MR data from one of an abdominal region and a myocardium region of a patient.

16. The method of claim 11 configured to homogeneously suppress blood pool signal.

17. A pulse sequence stored in memory of a computer and operationally carried out by an MR scanner to produce an MR image, the pulse sequence comprising;
a preparatory segment defined by a primary IR prep RF pulse that is non-spectrally selective, a secondary IR prep RF pulse that is spectrally selective, and a spectrum-targeted suppression RF pulse;
an acquisition segment defined by a readout sequence; and
wherein an MR scanner acquires MR signals during the readout sequence and stores the MR signals for use by a user in a tangible result.

18. The pulse sequence of claim 17 wherein the secondary IR prep RF pulse has a tip-up angle of approximately −180 degrees and is designed to restore longitudinal magnetization of fat spins.

19. The pulse sequence of claim 18 wherein the spectrum-targeted suppression RF pulse is a fat suppression RF pulse and is played out when longitudinal magnetization of the fat spins is at an equilibrium.

20. The pulse sequence of claim 19 wherein the fat saturation RF pulse has a flip angle of approximately 170 degrees for fat suppression of the myocardium region of a patient.

21. The pulse sequence of claim 17 configured to achieve simultaneous fat suppression and T1 inversion recovery contrast in MR imaging with uniform blood magnetization during readout in an inhomogeneous $B_0$ field.

22. The pulse sequence of claim 17 wherein the readout sequence is a gradient recalled echo (GRE) readout sequence and wherein the GRE readout gradient is designed to sample central k-space views when fat signal is nulled.

23. A computer readable storage medium having a computer program stored thereon and representing a set of instructions that when executed by a computer causes the computer to:
apply a non-spectrally selective IR pulse;
apply a spectrally selective IR pulse immediately after the non-spectrally selective IR pulse;
apply a fat suppression RF pulse;
acquire fat suppressed MR data; and
produce an MR image therefrom.

24. The computer readable storage medium of claim 23 wherein the computer is further caused to apply the fat suppression RF pulse when longitudinal magnetization of fat is at an equilibrium.

25. The computer readable storage medium of claim 24 wherein the computer is further caused to acquire the MR data in an image acquisition segment such that central k-space views are acquired when signal from fat is nulled.

26. The computer readable storage medium of claim 25 wherein the computer is further caused to apply the fat suppression RF pulse at a flip angle such that signal from fat is nulled during acquisition of the central k-space views.

27. The computer readable storage medium of claim 23 wherein the computer is further programmed to execute one of an echo planar imaging (EPI) image acquisition, a steady-state free precession image acquisition, and a fast spin echo image acquisition to acquire the fat suppressed MR data.

* * * * *